United States Patent [19]

Palazzetti et al.

[11] 3,851,294

[45] Nov. 26, 1974

[54] CONNECTOR FOR SEALINGLY INTERCONNECTING A MULTIPLE CORE ELECTRIC CABLE AND A PRINTED CIRCUIT

[75] Inventors: Mario Palazzetti, Avigliana; Franco Grisotto, Turin, both of Italy

[73] Assignee: Fiat Societa per Azioni, Turin, Italy

[22] Filed: Oct. 26, 1973

[21] Appl. No.: 410,060

[30] Foreign Application Priority Data

Oct. 31, 1972 Italy .............................. 70430/72

[52] U.S. Cl. ............. 339/17 F, 339/61 M, 339/174, 339/176 MF

[51] Int. Cl. ............................................ H05k 1/02

[58] Field of Search ......... 339/17, 18, 75, 176, 174, 339/97, 99, 192, 196, 103, 49, 47, 48, 59, 60, 61, 94

[56] References Cited

UNITED STATES PATENTS

| | | | |
|---|---|---|---|
| 3,307,139 | 2/1967 | Prise | 339/174 X |
| 3,329,851 | 7/1967 | Braeutigam et al. | 339/17 R X |
| 3,350,530 | 10/1967 | Fry | 200/166 |
| 3,509,296 | 4/1970 | Harshman et al. | 339/17 R X |
| 3,753,207 | 8/1973 | Maheux et al. | 339/17 F |

*Primary Examiner*—Paul R. Gilliam
*Assistant Examiner*—Terrell P. Lewis
*Attorney, Agent, or Firm*—Sughrue, Rothwell, Mion, Zinn & Macpeak

[57] ABSTRACT

A sealed connector for the connection of multi-core cables to printed circuit boards has an insulating support provided with a row of curved projections upon which individual deformable contact strips connected to or forming part of the cable conductors are deformed. These projections engage in a row of openings in a rigid insulating body which fits over the support, so that the deformed contact strips are level with or protrude through the upper surface of the body, on which the printed circuit board is clamped by a spring clip to effect connection with contact zones thereon. A deformable seal being interposed between the circuit board and the body to seal the connections.

5 Claims, 6 Drawing Figures

CONNECTOR FOR SEALINGLY INTERCONNECTING A MULTIPLE CORE ELECTRIC CABLE AND A PRINTED CIRCUIT

This invention concerns a connector for sealingly connecting a printed circuit board provided with a number of zones of contact or terminals to an electric cable having a number of conductors.

Electronic devices which are destined to function in environments where they are subject to the ingress of water or damp must be completely insulated and sealed from the outside, for example by insulating varnishes or sheathing. Connections between cables and printed circuit boards cannot therefore be made by using ordinary connectors, since these are not sealing, and may therefore allow short-circuits to occur as a result of seeping-in of damp.

Up to the present time, methods employed to effect sealed connections between the contact zones of a printed circuit board and conductors of a multi-core cable, whether the latter is of the traditional type or of the flat type having strip-like conductors, consisted of enclosing the connections, formed by conventional connectors, within a resin or some other thermosetting material in order to ensure impermeability of the connections to damp.

A method of this sort is clearly unsatisfactory, since it does not allow replacement of printed circuits, or any modifications to the connections other than by replacing the whole device, or at least that part of it enclosed in resin.

An object of the invention is to provide a connector for sealingly and detachably connecting printed circuits to either flat or traditional type cables.

According to the invention there is provided a connector for sealingly and detachably connecting the leads of a multi-core electric cable to zones of contact of a printed circuit board, comprising, in combination:

a. a first rigid insulating body having an elongate depression in one face;
b. a second rigid insulating body fixed to the said face of the first body and having a row of openings aligned with the elongate depression;
c. an elastically deformable insulating sealing member stuck on to the second body and having openings aligned with and corresponding to the said openings of the second body;
d. an insulating support of elastically deformable material housed in the depression in the first body and having curved projections which protrude through the openings in the second body and through the openings in the sealing member at least as far as the level of the surface of the sealing member facing away from the second body;
e. a number of deformable contact strips placed transversely to the support and each resting upon a respective said projection of the support, each contact strip being electrically sealingly and permanently connected to a respective conductor of the multi-core cable;
f. pressure means adapted to press a printed circuit board against the said sealing member so as to effect electric contact between the contact zones of the said board and the contact strips as a result of elastic deformation of the said sealing member.

The invention will now be described, by way of example, with reference to the attached drawings, in which.

Figure 1:
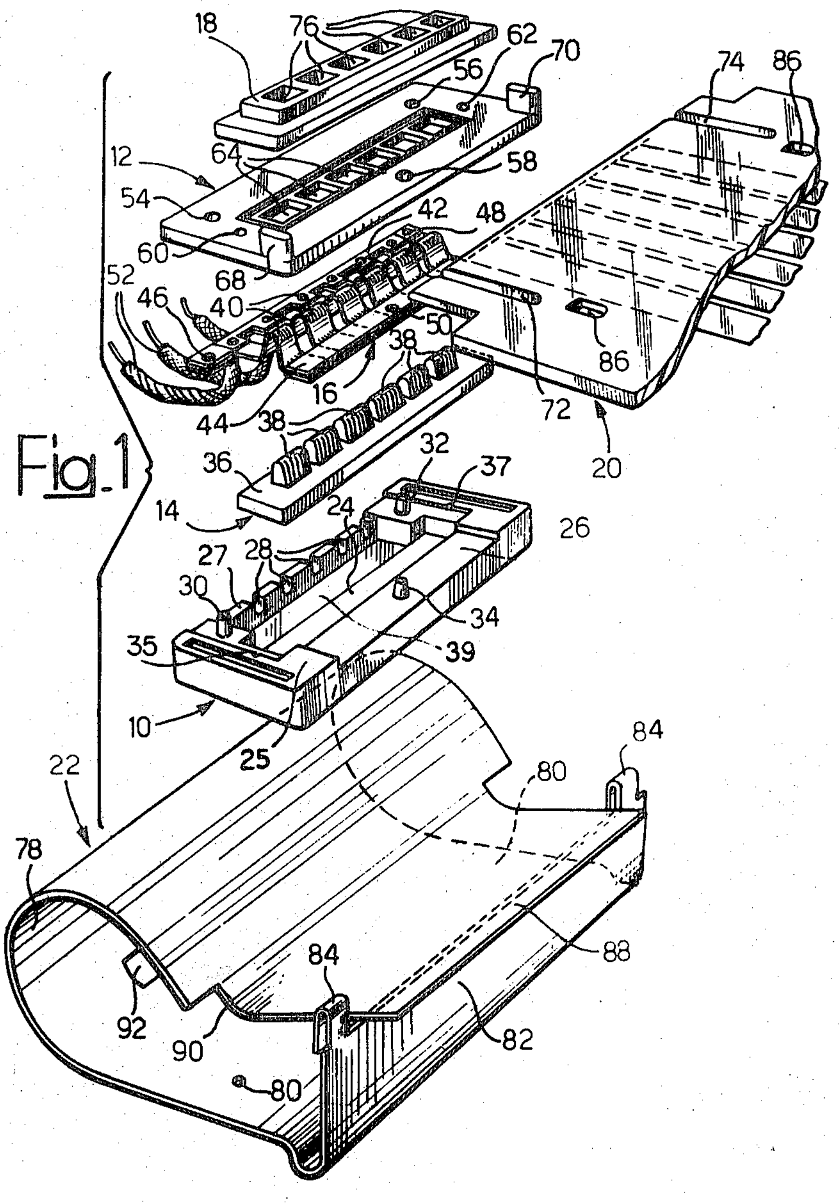
FIG. 1 is an exploded perspective view of a first embodiment of a sealed connector according to the invention, for connecting a printed circuit board to a cable of the traditional type.
Figure 4:
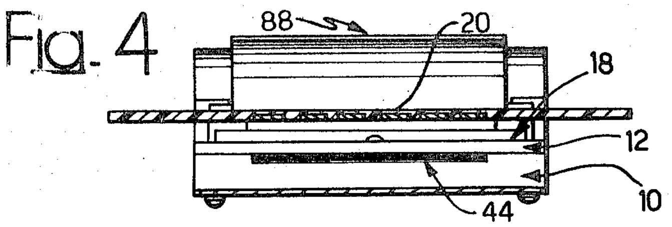
FIG. 4 is a sectional view taken along line IV—IV of FIG. 3.
Figure 2:
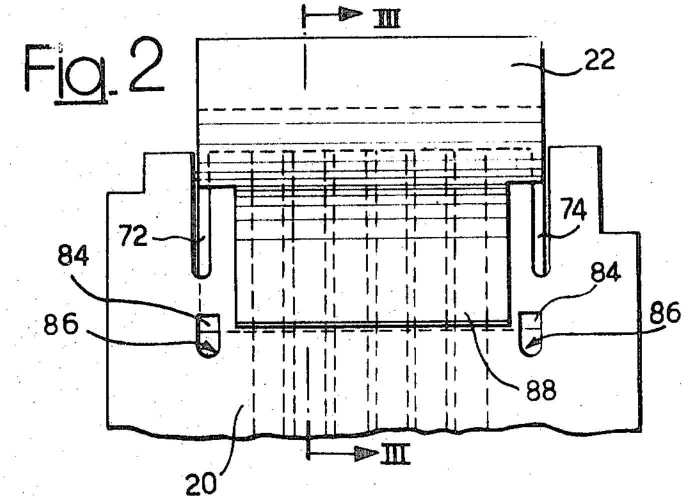
FIG. 2 is a plan view of the connector shown in FIG. 1.

First there will be described, with reference to FIGS. 1, 2, 3 and 4, a sealed connector according to the invention for connecting the conductors of a conventional multi-core cable, that is, one consisting of a bunch of stranded conductors each having its own insulating sheathing, to a printed circuit board. The connector has a lower body 10 and of an upper body 12, riveted together, with the interposition of an elastically deformable support 14 of yieldable rubber, a set of deformable strip contacts 16, and a sealing member 18 of yieldable rubber mounted upon the upper body 12. The connector is maintained in contact with a printed circuit board 20 by a substantially U shaped laminar pressure spring 22.

The lower body 10 consists of a block of rigid insulating material, such as that known by the commercial name of Noril, of rectangular shape, the upper surface of which is formed with a longitudinally extending depression 24 defined by two lateral walls 25 and 27. One lateral wall 25 has a lowered portion 26 and the opposite lateral wall, 27, has a series of notches 28. Upon the upper surface of the body 10 there are formed three upstanding aligning pins 30, 32 and 34, and two holes 35 and 37 to allow passage of the assembly rivets (not shown).

Figure 3:
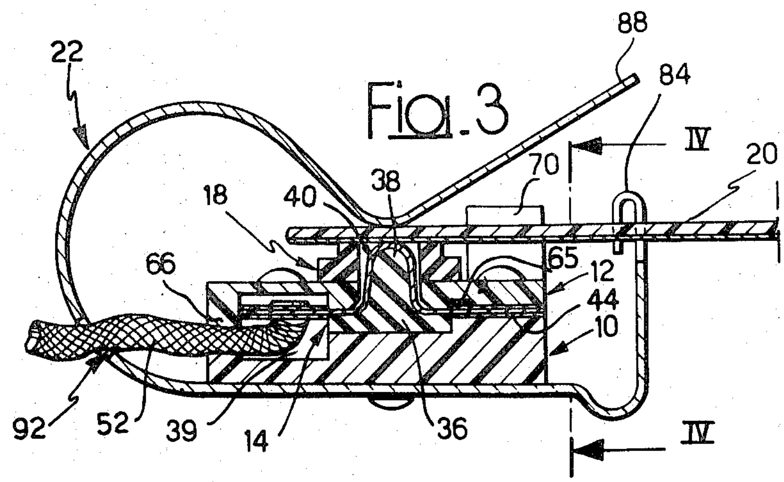
FIG. 3 is a sectional view taken along line III—III of FIG. 2.

One portion of the depression 24 in the lower body 10 houses the support 14, which consists of a yieldable rubber strip 36 from which there protrude six aligning curved projections 38 arranged in a row aligned with the depression 24. That portion of the depression 24 which is not occupied by the support 14 forms an elongate chamber 39 (FIG. 3). The set of contact strips 16 should for preference be made from a length of flat cable with strip-type conductors embedded within a flexible insulating covering of polyethaneterephthalate, known under the commercial name of Mylar (Registered Trade Mark), in which an intermediate portion is deprived of its insulating covering in order to allow the strip contacts to have access to the strip-like conductors. The uncovered portions of the strip-like conductors each have a curved portion 40 which fits over one of the projections 38 of the support 14. Flat terminal portions 42 and 44 upon the two sides of the uncovered curved portions 40 retain their insulating covering and, when assembly is completed (FIG. 3), the flat portion 42 rests partly upon a peripheral flange 36 of the support 14 and extends partly into the chamber 39, whilst the flat portion 44 rests on the lowered portion 26 of the wall 25 of the lower body 10 and partly also upon the peripheral flange 36 of the support 14. The terminal portions 42 and 44, are formed with holes 46, 48, 50, so positioned as to fit over the aligning pins 30, 32 and 34 of the lower body 10.

Insulated stranded wires 52 enter the elongate chamber 39 via the notches 28. The wires 52 are electrically connected, by known means such as soldering, riveting, or the like, to their respective contact strips 40, such connections being embedded within a waterproof resin (not shown) which wholly fills the chamber 39.

The upper body 12 consists of a rigid insulating plate, made, for example, of the same material as the lower body 10, and having the same rectangular shape as the latter. This insulating plate has three aligning holes 54, 56, 58, aligned with the holes 46, 48, 50 of the set of contact strips 16, engaging with the aligning pins 30, 32, 34 of the lower body 10. The body 12 also has two holes 60, 62 aligned with the holes 35, 37 of the lower body 10, for the passage of the assembly rivets and, finally, a number of rectangular openings 64 through which pass the projections 38 of the support 14 with the respective contact strips 40 placed upon them.

A longitudinally extending groove 65 upon the lower face of the upper body 12 is filled with flexible rubber compressed so as to form a seal with the flat portion 44 of the set of contact strips 16. The upper body 12 also has on one side a longitudinal flange 66 extending towards the lower body 10 in order to enclose, on one side, the connector assembly and defining with the notches 28 of the lower body 10 respective passages for the wires 52. Finally, at the two opposite longitudinal ends of the upper body 12 there are formed two upstanding guide elements 68, 70, designed to engage in corresponding slots 72, 74 in the circuit board 20, in order to ensure the correct positioning of the latter relative to the connector.

The flexible rubber sealing member 18 is fixed on the upper body 12, for example by adhesive. The sealing member 18 has openings 76 corresponding to the openings 64 of the body 12.

The laminar pressure spring 22 consists of a strip of harmonic steel, of width equal to the length of the lower body 10, curved to form a loop 78 in approximately its mid-length. On one side of the loop 78 the strip has a first substantially flat portion upon which the lower body 10 of the connector rests, the strip spring 22 being riveted to the lower body 10 through holes 80 in the latter. A second flat portion 82 adjoins the first flat portion and is perpendicular to the base of the lower body 10, terminating in two tongues 84 at opposite ends of the free edge of the flat portion 82 which are adapted to engage in positioning holes 86 in the board 20.

On the other side of the loop 78 the strip spring 22 first curves towards the body of the connector and then curves away from the connector in a substantially flat end portion 88, forming a knee 90 which in the operational position (FIG. 3) rests upon the board 20 in the zone of contact of the board 20 with the sealing member 18.

In one point of the loop 78 of the strip spring 22 there is made a longitudinal slot 92 which serves the double purpose of lightening the spring to reduce its rigidity, and forming a passage for the insulated wires 52 of an electric cable (not shown) located on the outside of the spring 22.

It will be evident that with the connector herein described a very tight seal can be achieved against any water or damp which might otherwise seep in so far as to reach the point of contact between the contact zones of the circuit board 20 and the contact strips 40. In fact, all the gaps through which water or damp which could seep in are provided with sealings of yieldable rubber subjected to strong pressure in use.

Figure 5:
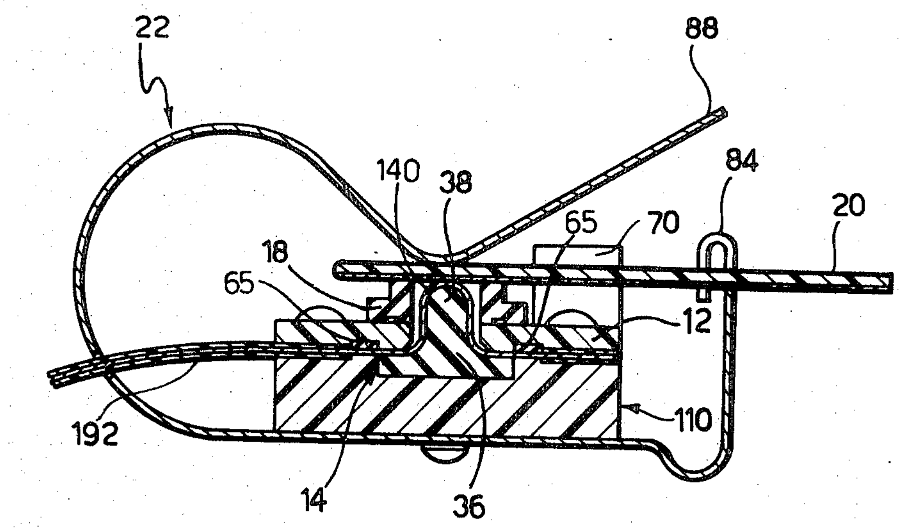
FIG. 5 is a sectional view, similar to the view in FIG. 3, of a second embodiment of a sealed connector according to the invention.
Figure 6:
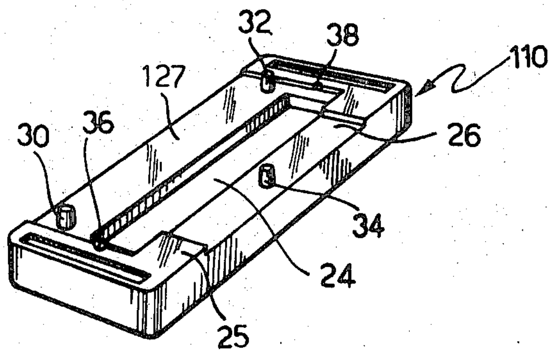
FIG. 6 is a perspective view of one component of the connector shown in FIG. 5.

FIGS. 5 and 6 show a second embodiment of a connector according to the invention which can be used with advantage where the cable with individually insulated stranded wires 52 shown in FIGS. 1 to 4 is replaced by a flat cable with strip-type conductors 152 embedded in a flexible insulating laminar covering. In FIG. 5 those components which are the same as those in FIGS. 1 to 4, are indicated by the same reference numerals, while components which are different from those of the embodiment of FIGS. 1 to 4 are indicated by the same reference numerals, increased by 100, as the corresponding components of FIGS. 1 to 4.

The connector illustrated in FIGS. 5 and 6 is basically similar to the connector of FIGS. 1–4, differing from it only in a constructional variant of the lower body 110, which in this case has no side chamber 39 for housing the connections between the cable conductors and the contact strips 40, and no side wall 27 with notches 28. In this embodiment the lower body 110 has a lowered side wall 127 which is level with the lowered portion 26 of the opposite side wall 25. The set of contact strips 140, curved into a loop, is in this embodiment made in one piece with the conductors 152 of the flat cable. It is, therefore, unnecessary to effect permanently sealed electric connections, as in the embodiment of FIGS. 1–4. The lowered wall 127 allows the passage of the flat cable right into the inside of the connector, and the groove 65, which is filled with a gummy resin, ensures an impermeable seal on the side of entry of the conductors 152.

We claim:

1. A connector for sealingly and detachably connecting the leads of a multi-core electric cable to zones of contact of a printed circuit board, comprising, in combination:

a. a first rigid insulating body having an elongate depression in one face;
b. a second rigid insulating body having a row of openings therein;
c. means fixing said second body to said one face of said first body with the elongate depression of the first body aligned with said row of openings;
d. an elastically deformable insulating sealing member stuck on to the second body and having openings therein aligned with and corresponding to said openings of the second body;
e. an insulating support of elastically deformable material housed in the depression in said first body and having curved projections protruding through the openings in the second body and through the openings in the sealing member at least as far as the level of the surface of the sealing member facing away from said second body;
f. a number of deformable contact strips placed transversely to the support and each resting upon a respective said projection of the support;
g. means for connecting each said contact strip electrically, sealingly and permanently to a respective conductor of the multi-core cable; and h. pressure means adapted to press the printed circuit board against said sealing member so as to effect electrical contact between the contact zones of said board and the contact strips as a result of elastic deformation of the said sealing member.

2. The connector defined in claim 1, wherein each contact strip has two flat portions trapped between the first body and the second body.

3. The connector defined in claim 1, wherein the second body has, upon its face which is turned towards the first body means defining a groove extending along an edge of the elongate depression in the first body, said groove filled with elastically deformable sealing material.

4. The connector defined in claim 1, wherein the contact strips consist of portions, stripped of protective covering, of flat conductors of a multi-core electric cable which is to be connected electrically, by means of the connector, to the printed circuit board.

5. The connector defined in claim 1, wherein a portion of the said elongate depression, defines a chamber in the first body and wherein terminal portions of the contact strips extend into said chamber where said connecting means are permanently sealed and connected to respective conductors of a multi-core cable, which conductors enter the chamber through notches in a side wall of said chamber.

* * * * *